(12) United States Patent
Azizi et al.

(10) Patent No.: US 8,977,998 B1
(45) Date of Patent: Mar. 10, 2015

(54) TIMING ANALYSIS WITH END-OF-LIFE PESSIMISM REMOVAL

(71) Applicant: Altera Corporation, San Jose, CA (US)

(72) Inventors: Navid Azizi, Markham (CA); Gordon Raymond Chiu, North York (CA); Ian Carlos Kuon, Toronto (CA); John Curtis Van Dyken, Toronto (CA)

(73) Assignee: Altera Corporation, San Jose, CA (US)

( * ) Notice: Subject to any disclaimer, the term of this patent is extended or adjusted under 35 U.S.C. 154(b) by 46 days.

(21) Appl. No.: 13/773,468

(22) Filed: Feb. 21, 2013

(51) Int. Cl.
*G06F 17/50* (2006.01)

(52) U.S. Cl.
CPC .................................. *G06F 17/5045* (2013.01)
USPC ........... 716/108; 716/106; 716/110; 716/111; 716/113; 716/134

(58) Field of Classification Search
USPC ......... 716/100, 106, 107, 108, 110–111, 113, 716/132, 134, 137–138
See application file for complete search history.

(56) References Cited

U.S. PATENT DOCUMENTS

| | | | |
|---|---|---|---|
| 5,636,372 A * | 6/1997 | Hathaway et al. ............ | 713/500 |
| 7,269,812 B2 | 9/2007 | Darsow | |
| 7,458,049 B1 * | 11/2008 | Tuncer et al. ................. | 716/113 |
| 7,636,905 B2 | 12/2009 | Darsow | |
| 8,056,035 B2 * | 11/2011 | Buck et al. .................... | 716/113 |
| 8,255,850 B2 * | 8/2012 | Jain et al. ...................... | 716/113 |
| 8,271,256 B2 * | 9/2012 | Khalily et al. ................. | 703/14 |
| 8,271,923 B2 | 9/2012 | Darsow | |
| 8,316,333 B2 | 11/2012 | Darsow | |
| 8,321,824 B2 | 11/2012 | Zejda | |
| 8,448,104 B1 * | 5/2013 | Kriplani et al. ................. | 716/56 |
| 8,522,183 B1 * | 8/2013 | McGuinness ................. | 716/113 |
| 8,572,532 B1 * | 10/2013 | Singh et al. .................... | 716/108 |
| 8,739,093 B1 * | 5/2014 | Ye .................. | 716/108 |
| 2003/0121013 A1 * | 6/2003 | Moon et al. ....................... | 716/6 |
| 2006/0112359 A1 * | 5/2006 | Becer et al. ....................... | 716/6 |
| 2007/0044053 A1 * | 2/2007 | Andreev et al. .................... | 716/6 |
| 2007/0143722 A1 * | 6/2007 | Venkateswaran et al. ........ | 716/6 |
| 2008/0216035 A1 * | 9/2008 | Dirks et al. ........................ | 716/6 |
| 2008/0244487 A1 * | 10/2008 | Nitta et al. ........................ | 716/6 |
| 2009/0132984 A1 * | 5/2009 | Chander et al. ................... | 716/6 |
| 2009/0307645 A1 * | 12/2009 | Buck et al. ........................ | 716/6 |
| 2010/0037192 A1 * | 2/2010 | Sugiyama ........................ | 716/6 |
| 2010/0097107 A1 * | 4/2010 | Dartu et al. .................... | 327/141 |
| 2010/0115488 A1 * | 5/2010 | Tanaka ............................ | 716/12 |
| 2010/0293512 A1 * | 11/2010 | Buck et al. ...................... | 716/2 |
| 2011/0041114 A1 * | 2/2011 | Komatsu ....................... | 716/134 |
| 2011/0283249 A1 * | 11/2011 | Bickford et al. .............. | 716/132 |
| 2012/0278778 A1 | 11/2012 | Bhardwaj | |
| 2012/0284680 A1 | 11/2012 | Iyer | |

OTHER PUBLICATIONS

Lorenz, D., et al., "Aging analysis at gate and macro cell level", 2010, IEEE, pp. 1-8.*

* cited by examiner

*Primary Examiner* — Stacy Whitmore (57) ABSTRACT

A method for using computing equipment to perform timing analysis on an integrated circuit design includes identifying a timing arc of the integrated circuit design. The timing arc may be a clock path or a data path in the integrated circuit design. A probability of the timing arc may be obtained and an aging effect for the timing arc may be calculated. The aging effect of the timing arc is calculated based on the probability. The timing arc may include maximum and minimum delays that are adjusted based at least partly on the calculated aging effect on the timing arc.

21 Claims, 10 Drawing Sheets

TIMING ANALYSIS WITH END-OF-LIFE PESSIMISM REMOVAL

BACKGROUND

The performance of an integrated circuit may be determined by the clock frequency at which it operates. Generally, electronic design automation (EDA) tools are used by circuit designers or design engineers to create circuit designs (commonly referred to as user designs) on integrated circuit devices. When designing a circuit, a circuit designer or design engineer may perform various operations using the EDA tool to validate the circuit design. This includes, among others, a timing analysis operation that is used to compute the expected timing of the circuit design without running actual circuit simulations.

Such timing operations may be commonly known as timing analysis. When a timing analysis is performed, every path or connection that couples one logic element to another in the circuit design may be evaluated. A typical timing analysis may produce two values for each analyzed path, namely, setup margin and hold margin. The setup margin of a particular signal path refers to the margin (or time period) available on the path for which a signal travelling through the path has to be stable before the arrival of its corresponding clock signal. The hold margin refers to the margin available on the signal path for which the same signal has to be stable after the arrival of its corresponding clock signal.

Generally, delays on respective paths on an integrated circuit may be modeled as a range of delays with a minimum value and a maximum value. Different delay values are typically used in the timing analysis. Depending on the delay values used, timing margins provided by the timing analysis may be overly pessimistic. For instance, when modeling transistor aging effects on a circuit design, the resulting timing analysis may be overly pessimistic when the circuit design is modeled solely based on a worst-case scenario (e.g., by increasing a maximum delay by an aging factor) without considering other factors such as the static probability of the path being analyzed.

SUMMARY

Techniques for performing a timing analysis on an integrated circuit design are disclosed. Embodiments of the present invention include methods to analyze timing on an integrated circuit design and to help reduce pessimism from the resulting timing analysis to ease timing closure.

It is appreciated that the present invention can be implemented in numerous ways, such as a process, an apparatus, a system, a device or a computer readable medium. Several inventive embodiments of the present invention are described below.

A method for using computer equipment to perform timing analysis on an integrated circuit design includes identifying a timing arc of the integrated circuit design. The timing arc may be a clock path or a data path in the integrated circuit design. The method further includes obtaining a probability of the timing arc and calculating an aging effect for the arc based on the probability. As an example, if the timing arc is a non-gated clock path, its probability may be approximately fifty percent. Maximum and minimum delays for the timing arc may then be adjusted based at least partly on the calculated aging effect on the timing arc.

Software on a computer-readable storage media to be implemented on a computer-aided design tool to perform timing analysis on an integrated circuit design may include code for identifying a timing arc in the integrated circuit design. The timing arc may be a clock path or a data path that includes minimum and maximum delays. The software may further include code for calculating an end-of-life effect for the timing arc and code for adjusting the minimum and maximum delays for that timing arc. The minimum and maximum delays for the timing arc may be adjusted based at least partly on the calculated end-of-life effect. For instance, the minimum delay for the timing arc may be adjusted based on the aging effect and a recovery effect. The adjustments made to the minimum and maximum delays may reduce pessimism in the timing analysis of the integrated circuit design.

If desired, performing timing analysis on an integrated circuit design may include selecting source and target registers from the integrated circuit design. The method may further include identifying at least one common clock path for the source and target registers in the integrated circuit design. In one embodiment, the common clock path may have diverging path segments. The method may include determining end-of-life pessimism in the timing analysis on the diverging path segments in the common clock path. The end-of-life pessimism may then be removed from the diverging path segments of the common clock path.

DETAILED DESCRIPTION

The embodiments provided herein include techniques to perform timing analysis on an integrated circuit design.

It will be obvious, however, to one skilled in the art, that the present exemplary embodiments may be practiced without some or all of these specific details. In other instances, wellknown operations have not been described in detail in order not to unnecessarily obscure the present embodiments.

Figure 1:
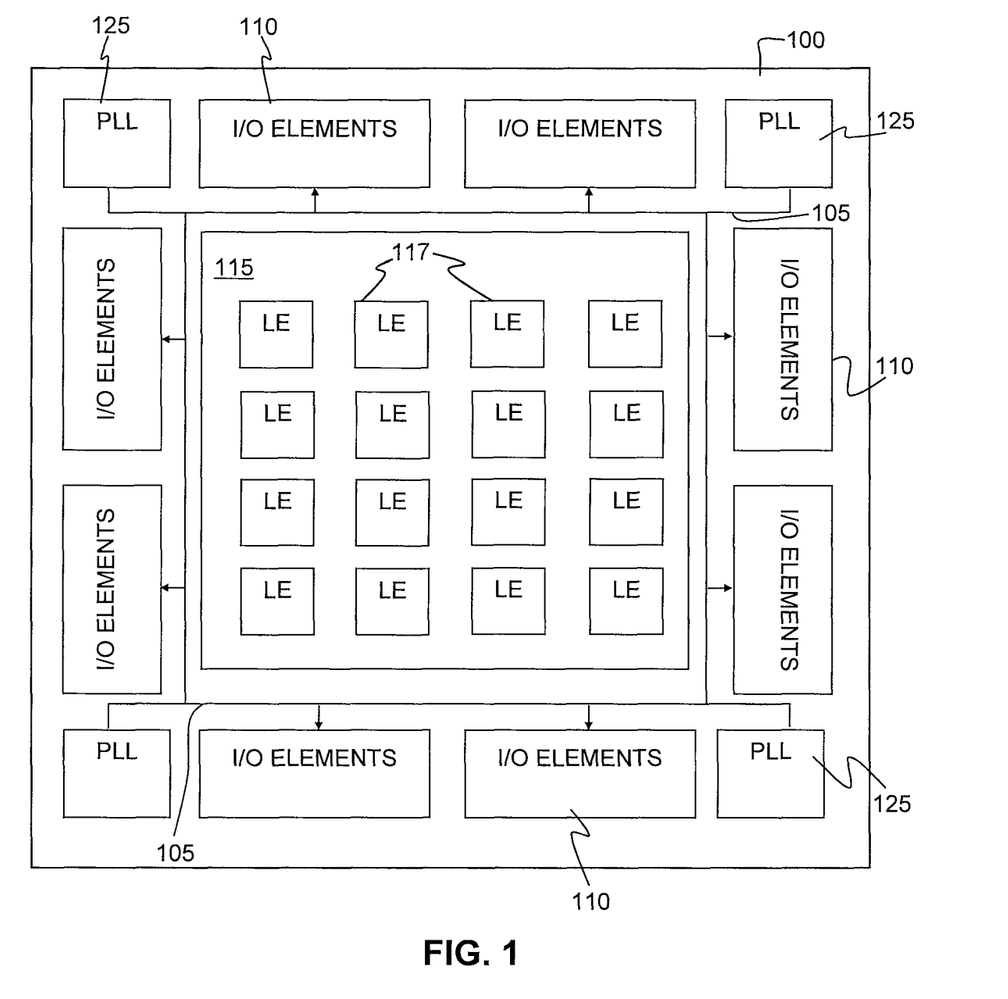
FIG. 1 is a simplified block diagram of an integrated circuit in accordance with one embodiment of the present invention.

An IC device such as a field-programmable gate array (FPGA) device or an application specific integrated circuit (ASIC) device, generally includes, among others, memory modules, logic blocks, clock generation circuitry, and input-output elements. FIG. 1, meant to be illustrative and not limiting, shows a simplified block diagram of IC 100. IC 100 includes core logic region 115 and input-output elements 110. It should be appreciated that a single device like IC 100 can potentially support a variety of different interfaces and each individual input-output bank 110 can support a different input-output standard with a different interface or protocol (e.g., high-speed serial interface protocol).

Other circuits, such as phase-locked loops (PLLs) 125, for clock generation and timing, may also be located outside core logic region 115 (e.g., at corners of IC 100 or adjacent to input-output elements 110). Integrated circuit (IC) devices generally use a clock signal to synchronize different circuit elements in the device. In the embodiment of FIG. 1, IC 100 may include clock network 105. It should be appreciated that clock network 105 may be used to transmit clock signals from clock circuits (e.g., PLLs 125) to various parts of IC 100.

Signals received from external circuitry at input-output elements 110 may be routed from input-output elements 110 to core logic region 115, PLLs 125 or other logic blocks (not shown) on IC 100. Core logic region 115 (or more specifically, logic elements (LEs) 117 or core registers within core logic region 115) may perform functions based on the signals received. Accordingly, signals may be sent from core logic region 115 and other relevant logic blocks of IC 100 to other external circuitry or components that may be connected to IC 100 through input-output elements 110.

As shown in FIG. 1, core logic region 115 may be populated with logic cells that may include LEs 117 or core registers, among other circuits. The LEs may further include look-up table-based logic regions and may be grouped into "Logic Array Blocks" (LABs). The LEs and groups of LEs or LABs can be configured to perform logical functions desired by a user or circuit designer.

As an example, a circuit designer may design a circuit that performs specific logic functions. Typically, a circuit designer may use an electronic design automation (EDA) tool when designing a circuit. The process of designing a circuit to be implemented on an IC device such as IC 100 may be done in several steps with a typical EDA tool. The EDA tool may accordingly produce an output file (e.g., a configuration file) that is then used to configure the IC device with the user design. Alternatively, the EDA tool may also produce an output file (e.g., a binary file) to generate masks (based on the user design) for an IC device.

Figure 2:
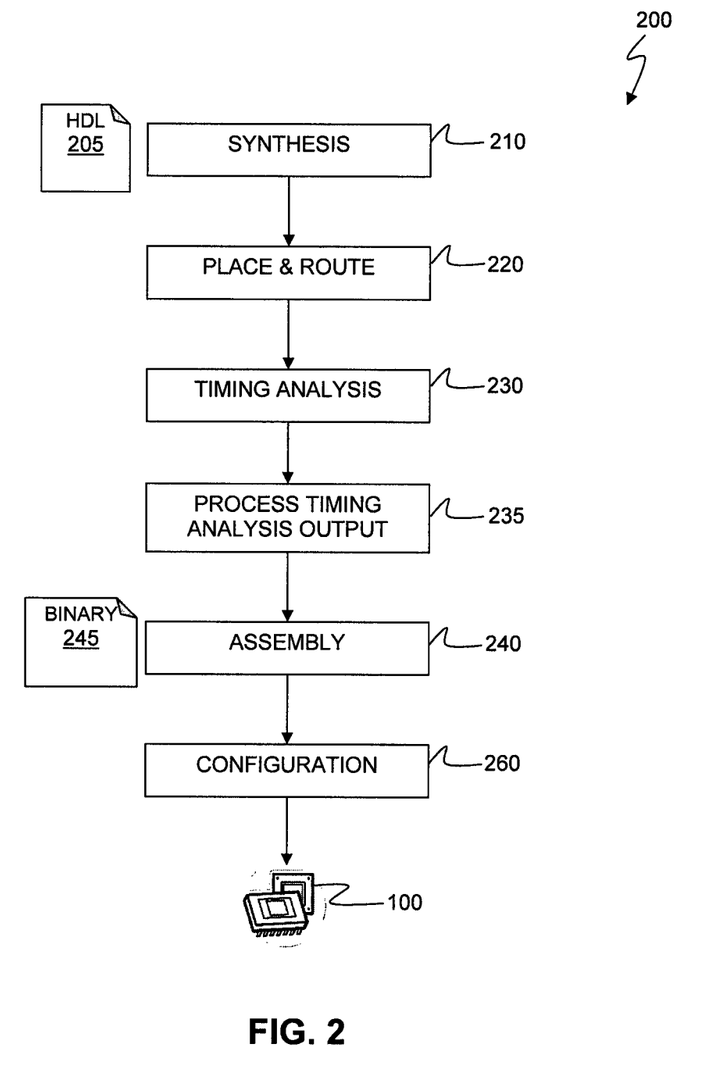
FIG. 2 depicts an illustrative method to create and compile a circuit design for an IC using an EDA tool in accordance with one embodiment of the present invention.

FIG. 2 depicts illustrative method 200 to create and compile a circuit design for an IC using an EDA tool in accordance with one embodiment of the present invention. Method 200 may begin when a circuit designer or engineer create a circuit design that is embodied in a hardware description language (HDL) file 205. HDL file 205 may be synthesized by the EDA tool during synthesis step 210. For instance, synthesis operation performed at step 210 may translate the circuit design embodied in HDL file 205 into a discrete netlist of logic-gate primitives. The synthesized logic gates in the circuit design are then placed and routed on a target IC device during a place and route operation at step 220. Generally, wire nets may be added to connect the logic gates and other components on the target IC device to route signals in the circuit design during the place and route operation at step 220.

After the place and route operation, a timing analysis operation may be performed at step 230. In one embodiment, the timing analysis operation may be a static timing analysis operation that is performed on the integrated circuit design to obtain the expected timing of the circuit design. It should be appreciated that the timing analysis operation may compute the delays of different paths in the circuit design and the timing constraints of the overall circuit design. For instance, the timing analysis operation performed at step 230 may calculate the maximum and minimum delays of respective timing paths in the circuit design. The maximum and minimum delays may be calculated based on different factors including transistor aging and other factors such as on-chip variation (e.g., process, temperature and voltage variations).

Binary configuration file 245 may then be produced during an assembly operation at step 240. Binary configuration file 245 contains description of the circuit design and may be used to program IC device 100 (e.g., contents of binary configuration file is loaded onto IC device 100) during a configuration operation at step 260. In one embodiment, prior to fabricating the IC or loading the configuration on the actual device (e.g., programming IC device 100 with binary configuration file 245), the output of the timing analysis operation performed at step 230 may be analyzed and processed at step 235 to ensure that timing requirements are met in order for the circuit design to operate correctly. As an example, signals that arrive too early or too late after a clock's active transition may cause undesired errors during operation of the circuit.

Figure 3A:
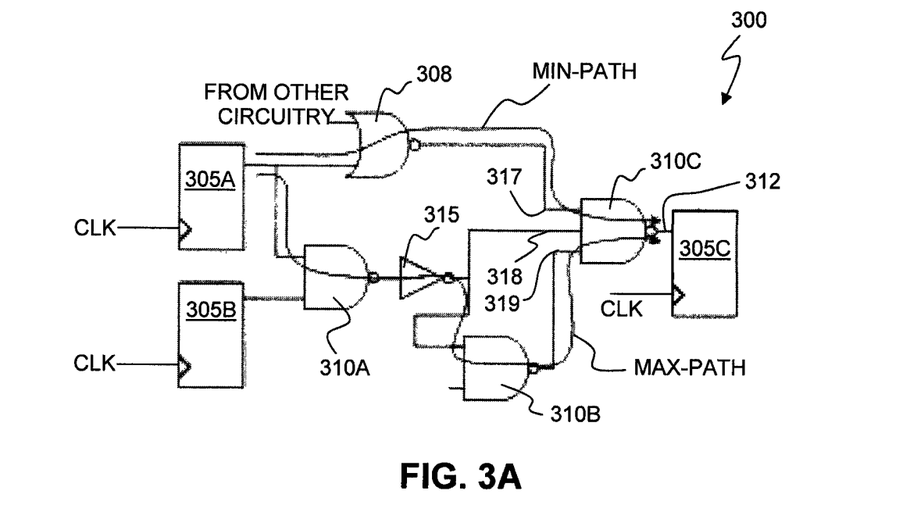
FIG. 3A shows an illustrative circuit design with multiple circuit elements and the different paths that respective signals traverse to reach a destination register in accordance with one embodiment of the present invention.

FIG. 3A shows illustrative circuit 300 with multiple circuit elements and the different paths that respective signals take to reach a destination register in accordance with one embodiment of the present invention. Circuit 300 includes registers 305A-305C, NOR circuit 308, NAND circuits 310A-310C, and inverter 315. It should be appreciated that circuit 300 is a simplified circuit diagram used to illustrate data and clock paths and their respective delays. Therefore, specific details are left out in order to not unnecessarily obscure the present invention. As shown in FIG. 3A, each of registers 305A-305C is clocked by a clock signal, CLK. The respective outputs of registers 305A and 305B may be transmitted to register 305C via multiple circuit elements.

As an example, the output of register 305A may be coupled to NOR circuit 308 and an input terminal of NAND circuit 310A. The output of register 305B may be coupled to another input terminal of NAND circuit 310A. The respective outputs from registers 305A and 305B may be "nanded" by NAND circuit 310A to produce and output at output terminal of NAND circuit 310A. In circuit 300, there may be an inverter 315 that is coupled to the output terminal of NAND circuit 310A. Therefore, the resulting output signal from NAND circuit 310A may be inverted by inverter 315 before being transmitted to NAND circuits 310B and 310C. It should be appreciated that NAND circuit 310B may receive other signals from other circuits (not shown).

In FIG. 3A, NAND circuit 310C may be a three-input NAND circuit that receives output signals from NAND circuit 310B, inverter 315, and NOR circuit 308. Accordingly, the output terminal of NAND circuit 310C may be coupled to an input terminal of register 305C. Every circuit element may have its own delay and as such, depending on the path that a signal takes to reach its destination, different signals (or even the same signal) travelling through different paths may experience different delays. As an example, in FIG. 3A, NAND circuit 310C receives three signals from three different paths.

Assuming each circuit element in circuit 300 incurs approximately the same amount of delay, a signal path with more circuit elements will have a higher delay compared to a signal path with fewer circuit elements. As such, the signal received at input terminal 317 of NAND circuit 310C requires less time (compared to signals received at respective input terminals 318 and 319) to travel from source register 305A to NAND circuit 310C via MIN-PATH. Conversely, the signal received at input terminal 319 of NAND circuit 310C requires more time (compared to signals received at respective input terminals 317 and 318) to travel from source registers 305A and 305B to NAND circuit 310C via MAX-PATH.

As register 305C is clocked by clock signal CLK, the output signal from NAND circuit 310C may need to be properly coordinated with its clock signal, CLK. For instance, the output signal 312 from NAND circuit 310C may need to be ready (transmitted to the input terminal of register 305C) before the clock signal, CLK, transitions to an active state. Generally, to meet timing, a signal has to be stable for a specific duration of time before and after the arrival of its corresponding clock signal. This is commonly referred to as the setup time and hold time of a signal.

Figure 3B:
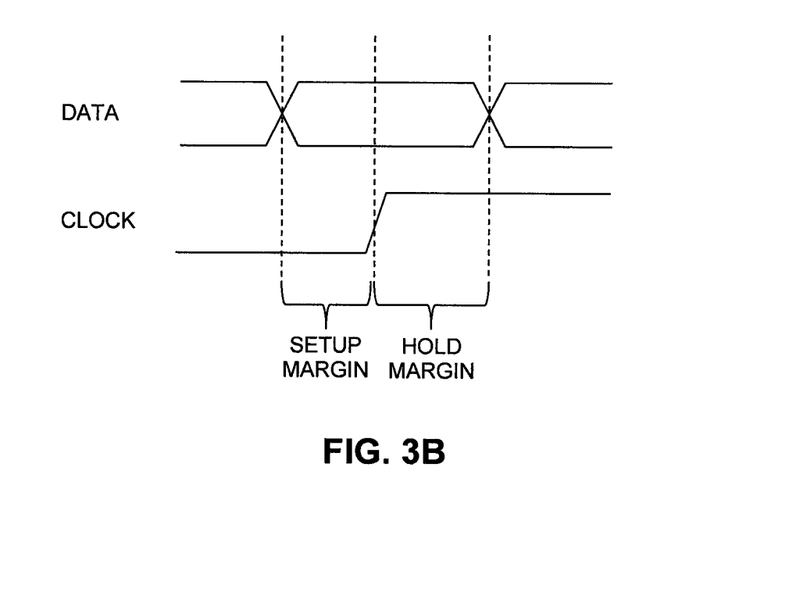
FIG. 3B is a timing diagram illustrating setup and hold margins for a data signal and a corresponding clock signal in accordance with one embodiment of the present invention.

FIG. 3B depicts a data signal and its corresponding clock signal with its setup and hold margins. As shown in FIG. 3B, the setup margin refers to the amount of time that is needed for a changing signal to be stable prior to a clock transition (e.g., a zero-to-one transition or a one-to-zero transition). This ensures that rising edges of the clock signal correspond to the appropriate data windows. As an example, the clock signal may represent clock signal CLK of FIG. 3A and the data signal may represent the output signal 312 of NAND circuit 310C that is received by register 305C. In order for data to be properly captured by register 305C, the output signal 312 of NAND circuit 310C may need to arrive before the clock signal, CLK, at the clock terminal of register 305C. Preferably, there must be an adequate amount of time for the received data to be stable prior to the arrival of the clock signal (i.e., the time between the transition of the data signal and the transition of its corresponding clock signal). This may be referred to as the setup margin.

After the arrival of the clock signal (that is, after the clock signal transitions to its active state), the data signal may need to be held stable for a certain period of time or at least as long as is possible for the data signal to be appropriately captured. This may be referred to as the hold margin. A timing violation may occur if either of these margins are too small for data signals to be correctly captured by the circuit. For instance, when the data signal changes too quickly after the clock's transition, a hold time violation may occur. When the data signal arrives too late and misses the clock transition, a setup time violation may occur.

Accordingly, when designing a circuit, an engineer or circuit designer will typically perform a timing analysis to ensure that the circuit design meets timing requirements prior to implementing the design on an actual device. When performing timing analysis on a circuit design (e.g., when performing the timing analysis operation of step 230 of FIG. 2), different delays may be applied to the data and clock paths (also referred to as timing arcs) in the circuit design to simulate worst and best case scenarios. For instance, each timing arc in a circuit design may have its own associated minimum and maximum delays. Depending on the delays applied, the timing margin (e.g., either setup or hold margin) may be increased or decreased. Typically, the worst case timing margin (amount) is used in the timing analysis.

To obtain the worst-case setup margin (amount), maximum delay is applied to the data path while minimum delay is applied to the clock path. That is to say, the data signal will arrive later and the clock signal will arrive earlier, essentially providing the worst-case setup time available for the data signal to stabilize before the arrival of the clock signal. To obtain the worst-case hold margin, minimum delay is applied to the data path while maximum delay is applied to the clock path. In other words, the data signal will be held for a shorter period of time before its next transition and the clock signal will stay in an active state for a longer period of time.

As circuit timing may vary due to various factors (e.g., the received signals may vary, temperature or voltage may change, transistors in the device may age or degrade, etc.), the maximum and minimum delays for the respective timing arcs in the circuit design may need to be adjusted accordingly to take into account some of these factors. In general, the performance of transistors may degrade over time (e.g., transistors may degrade due to factors such as temperature instability and hot carrier injection). An aging transistor may have a reduced current drive. The diminished current drive of an aging transistor may increase propagation delay (this may be referred to as the end-of-life (EOL) effect of a transistor). As an example, to perform an EOL effect timing modeling on a particular timing arc, its setup margin may be reduced by increasing the data path delay by a transistor aging factor and its hold margin may be reduced by increasing the clock path delay by the same factor. However, reducing both the setup and hold margins may be overly pessimistic and may reduce the performance of the device.

Figure 4:
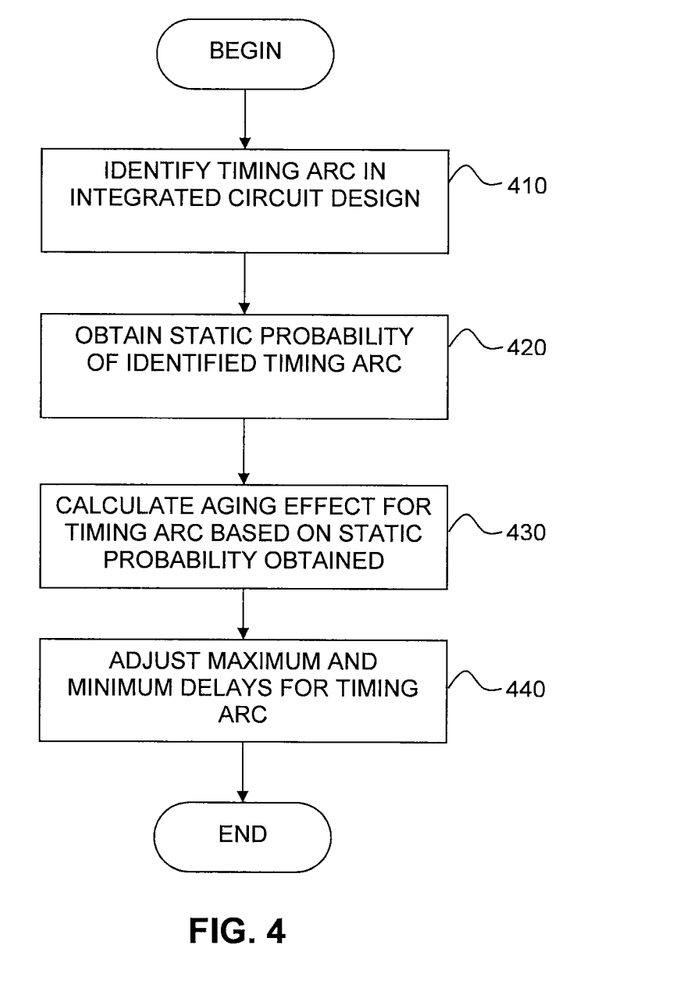
FIG. 4 is a flow chart of illustrative steps for performing timing analysis on an integrated circuit design in accordance with one embodiment of the present invention.

An improved timing analysis may allow timing margin to be reclaimed (e.g., by reducing unnecessary pessimism in setup and hold margin calculations). FIG. 4 depicts an illustrative method for performing timing analysis on an integrated circuit design in accordance with one embodiment of the present invention. At step 410, a timing arc in the integrated circuit design may be identified. As an example, the timing arc may be a clock path or a data path similar to that shown in circuit 300 of FIG. 3A. A static probability of the timing arc is obtained at step 420. The static probability of a signal may be the fraction of time that the signal is at a logic high level (e.g., logic 1) during the period of device operation that is being analyzed. Accordingly, static probability may range from 0 (e.g., when the signal is constantly at a logic low or ground level) to 1 (e.g., when the signal is constantly at a logic high level). At step 430, an aging effect for the timing arc is calculated based on the static probability obtained. It should be appreciated that the aging effect may be dependent on the circuit structure and process technology. Therefore, at step 430, the aging effect may be scaled by based on the static probability.

In one embodiment, the timing arc may be a non-gated clock path with a 50% static probability. As such, the aging effect may be calculated based on a 50% static probability. It should be appreciated that a clock signal that is directly used to clock a register (e.g., CLK signal clocking registers 305A-305C of FIG. 3A) may be referred to as a non-gated clock, whereas an output of a logic circuit that is used to clock a register (e.g., the output of AND circuit 710 of FIG. 7A) may be referred to as a gated clock signal. The maximum and minimum delays for the timing arc may then be adjusted at step 440 based on the calculated aging effect. In one embodiment, both the minimum and maximum delays for the timing arc are increased. However, instead of simply increasing the minimum or maximum delay by a particular factor, the minimum and maximum delays may be adjusted based on a more realistic scenario (e.g., based on the static probability of the signal). For instance, instead of increasing just the maximum delay by a worst-case EOL effect without increasing the minimum delay, both the minimum and maximum delays may be increased by a specific EOL effect factor that is scaled based on the static probability of the signal. This may increase the timing margins of the circuit design as the amount of increase in the maximum delay in this case may be lower than the amount of increase that is based on a worst-case EOL effect.

Figure 5:
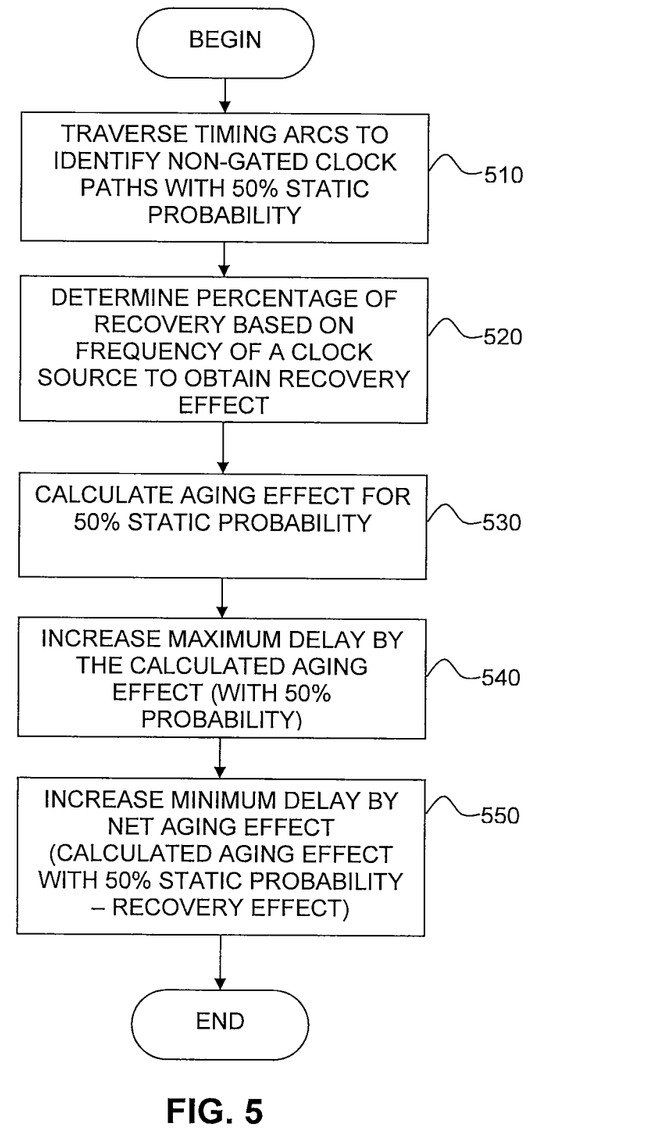
FIG. 5 shows an illustrative method for modeling aging effects on a clock path in accordance with one embodiment of the present invention.

FIG. 5 shows an illustrative method for modeling aging effects on a clock path in accordance with one embodiment of the present invention. At step 510, timing arcs in a circuit design may be traversed to identify non-gated clock paths with 50% (or approximately 50%) static probability. Non-gated clock paths generally have a 50% static probability (or between 40%-60% probability) as the clock signal is continuously toggling between a logic high level and a logic low level. As such, transistors in those timing arcs may be uniformly stressed (e.g., the transistors may age at the same rate). In general, transistors (either PMOS or NMOS transistors) are stressed when turned on and their threshold voltage may increase, causing extra delay (commonly known as transistor aging). When they are turned off (or when the stress factor is removed), they may be in a recovery stage and their threshold voltage may decrease. At step 520, the percentage of recovery for each timing arc is determined based on the frequency of a source clock signal of that timing arc (e.g., a lower frequency clock may recover faster than a higher frequency clock) to obtain the recovery effect of that timing arc.

At step 530, the aging effect for that timing arc is calculated based on a 50% static probability. At step 540, the maximum delay of that timing arc is increased by the calculated aging effect. Accordingly, the minimum delay is increased at step 550 by a net aging effect. In one embodiment, the net aging effect is calculated by subtracting the percentage of recovery that is determined at step 520 from the calculated aging effect obtained at step 530.

The method depicted in FIG. 5 may be performed at various stages during a compilation flow of a circuit design (e.g., method 200 of FIG. 2). In one embodiment, the method may be performed during a timing analysis operation similar to timing analysis operation 230 of FIG. 2. For example, during timing analysis, a timing netlist may be traversed to identify non-gated clock timing arcs and their respective delays may be calculated accordingly. In another embodiment, the minimum and maximum delays for the respective timing arcs may be obtained during a delay annotation stage prior to the static timing analysis or timing simulation operation. For instance, delay annotation (not shown) may be performed after the place and route operation at step 220 of FIG. 2. In the same figure, the timing analysis operation that is performed at step 230 may then use the adjusted minimum and maximum when checking for setup and hold violations, among other timing verifications performed.

In yet another embodiment, during the delay annotation stage, two sets of minimum and maximum delays (e.g., pre-adjusted delays and adjusted delays) may be produced for the respective timing arcs in the circuit design. In this example, prior to performing static timing analysis, the timing netlist may be traversed to identify all the non-gated clock paths. The adjusted maximum and minimum delays may then be applied to all the identified non-gated clock paths and timing analysis may be performed using the adjusted delays for the non-gated clock paths. Alternatively, the timing netlist may be traversed during timing analysis to identify non-gated clock paths in the circuit design. In this scenario, appropriate minimum and maximum delays may be selected by the static timing analysis engine when performing timing analysis on the circuit design.

Figure 6:
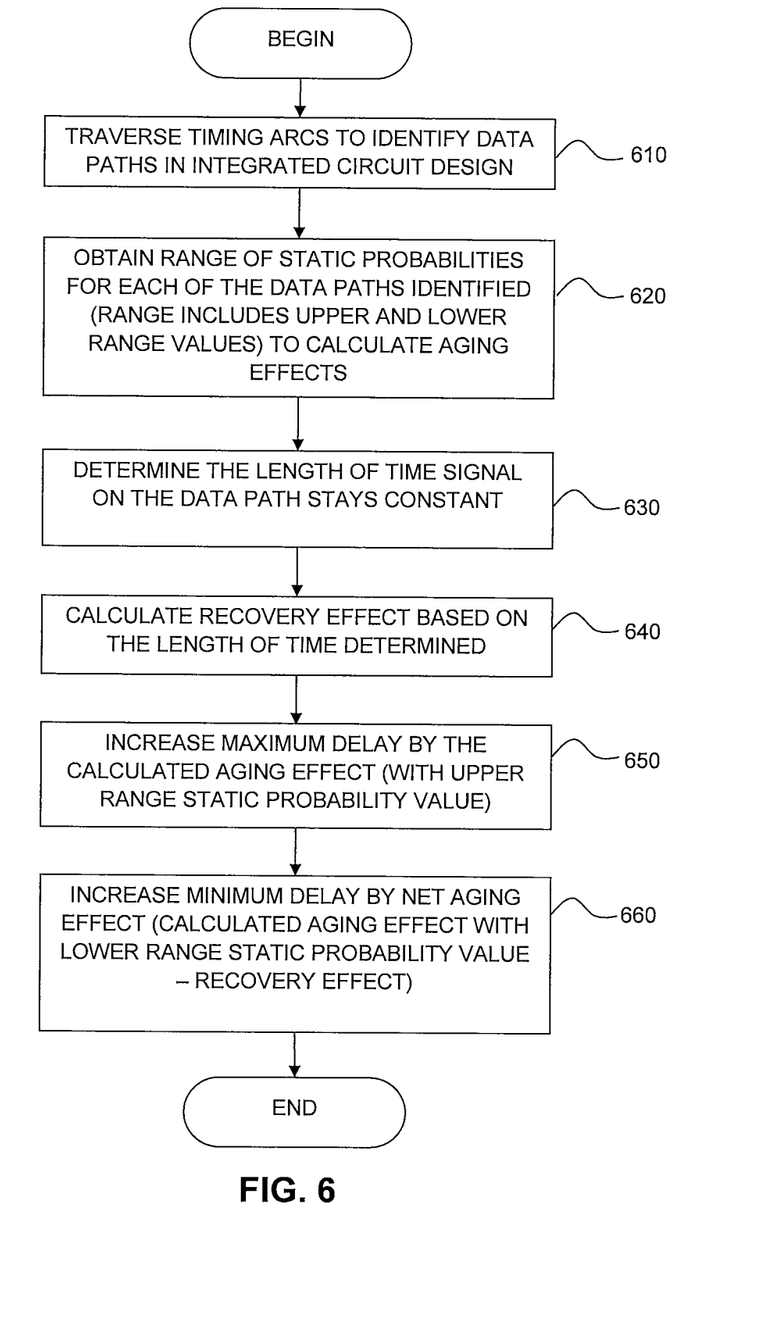
FIG. 6 shows an illustrative method for modeling aging effects on a data path in accordance with one embodiment of the present invention.

FIG. 6 shows an illustrative method for modeling aging effects on a data path in accordance with one embodiment of the present invention. At step 610, timing arcs in a timing netlist are traversed to identify data paths in an integrated circuit design. For each of the data paths identified, a range of static probabilities is obtained at step 620. The range may include upper and lower range values that may be used to calculate appropriate aging effects for that particular data path. At step 630, the length of time that a signal stays constant on that data path may be determined at step 630. In one embodiment, the longest time a signal on a particular data path can stay constant (e.g., the length of time that the signal may stay at either a logic high level or a logic low level) may be used to calculate a recovery effect for that particular data path. It should be appreciated that the length of time that the signal can stay constant may limit the recovery effect of that particular data path.

In one embodiment, the length of time that the signal can stay constant (or the static probability of a signal) may be estimated from simulation test vectors for the circuit design, user input or functional analysis of the design that is obtained via synthesis, such as the synthesis operation performed at step 210 of FIG. 2. At step 640, the recovery effect is calculated based on the length of time determined at step 630. The maximum delay is increased by the calculated aging effect at step 650. In one embodiment, maximum and minimum aging effects may be calculated based on the respective upper and lower range values obtained at step 620. In another embodiment, only one of the aging effects (that is, either the maximum or the minimum aging effect) may be adjusted. The upper static probability value is used to calculate the maximum aging effect that is then used to adjust the maximum delay at step 650.

At step 660, the minimum delay is increased by a net aging effect. The lower static probability value obtained at step 620 may be used to calculate the minimum aging effect and the net aging effect may be obtain by subtracting the recovery effect calculated at step 640 from the minimum aging effect. In one embodiment, the steps depicted in FIG. 6 may be performed during a delay annotation stage that takes place after a place and route operation and prior to a static timing analysis operation. Accordingly, timing arcs in the circuit design may be annotated with the appropriate minimum and maximum delay values based on the range of static probabilities for each timing arc (or more specifically, data path) in the circuit design. In another embodiment, the steps in FIG. 6 may be performed during a static timing analysis operation such as the timing analysis operation at step 230 of FIG. 2. In this example, the timing netlist may be traversed during timing analysis to identify timing arcs that are data paths. Appropriate delays (based on their respective ranges of static probabilities) may then be generated accordingly for the identified timing arcs.

Figure 7A:
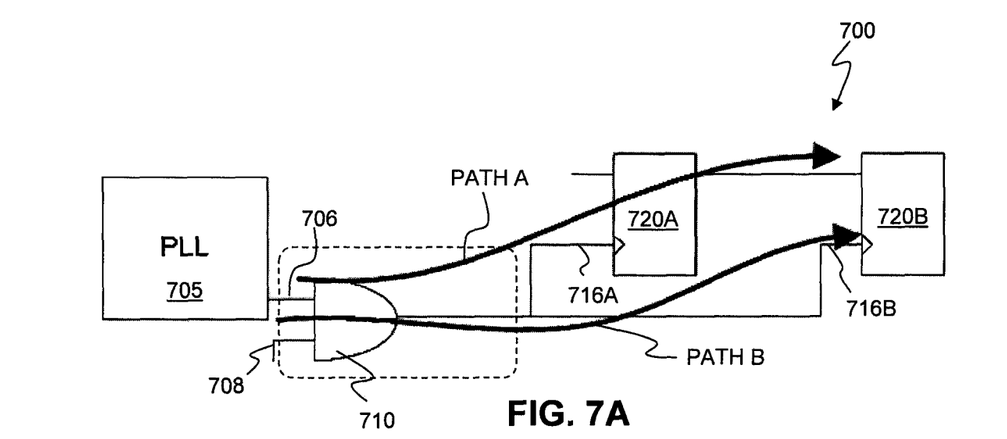
FIG. 7A is an illustrative circuit with circuit elements clocked by a gated clock signal in accordance with one embodiment of the present invention.

FIG. 7A shows illustrative circuit 700 with circuit elements clocked by a gated clock signal in accordance with one embodiment of the present invention. Both registers 720A and 720B in circuit 700 are clocked by a gated clock signal from PLL circuit 705. In one embodiment, PLL circuit 705 may be a clock source on an integrated circuit device, similar to PLL 125 of FIG. 1, that produces clock signals to synchronize different circuit elements that are coupled together. Clock signals from PLL circuit 705 may be "anded" by AND circuit 710 before being transmitted to the respective clock terminals 716A and 716B of registers 720A and 720B. It should be appreciated that AND circuit 710 may receive clock signals from PLL circuit 705 at input terminal 706 and may receive signals from other circuit elements (not shown) at input terminal 708.

In the embodiment of FIG. 7A, as the output of register 720A is feeding register 720B, register 720A may be referred to as a source register while register 720B may be referred to as a target register. As can be seen in FIG. 7A, both registers 720A and 720B share a common clock source (i.e., from PLL circuit 705) and a common clock path (denoted by a dotted-line box in FIG. 7). Two diverging segments from the common clock path are coupled respectively to registers 720A and 720B.

As register 720B is the target register in this example, PATH A (the path that data signals received by register 720B travel through) may be the data arrival path and PATH B (the path that clock signals travel through from the clock source to the clock terminal of target register 720B) may be the data required path in circuit 700. In one embodiment, the diverging path segments may experience similar end-of-life or aging effects as they share a common clock source. Accordingly, when a timing analysis is performed on circuit 700, the minimum and maximum delays for PATH A and PATH B may be adjusted based on their common end-of-life effect.

Figure 7B:
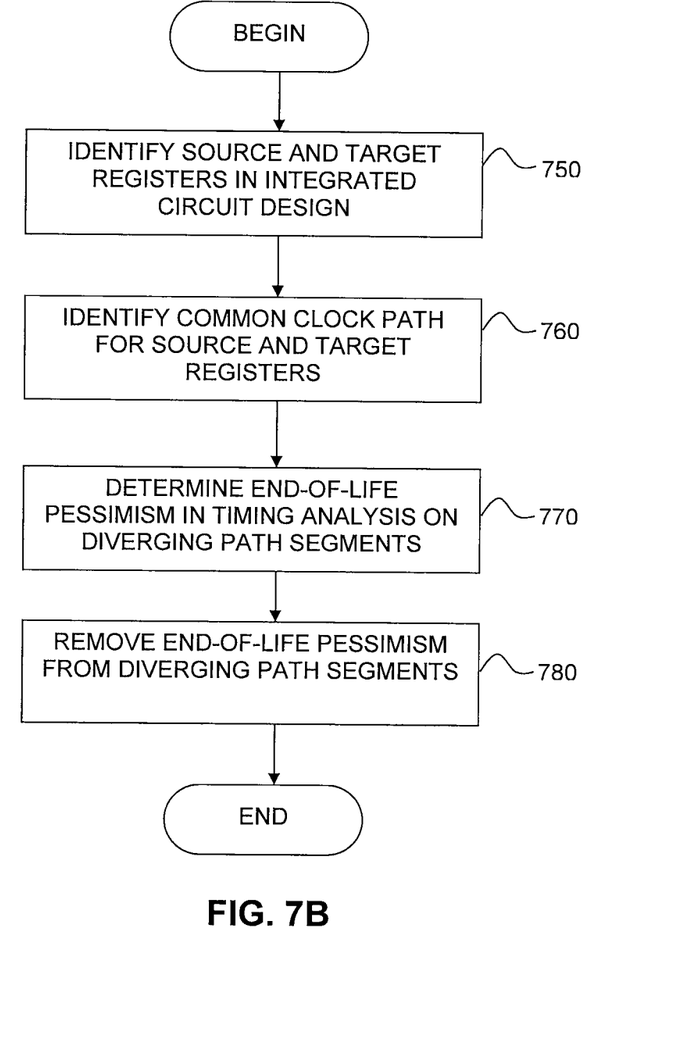
FIG. 7B depicts an illustrative method for performing timing analysis on an integrated circuit design in accordance with one embodiment of the present invention.

FIG. 7B depicts an illustrative method for performing timing analysis on an integrated circuit design in accordance with one embodiment of the present invention. As an example, the method shown in FIG. 7B may produce a timing model with reduced pessimism for a circuit with a gated clock signal (e.g., circuit 700 of FIG. 7A). At step 750, a source and target registers are identified from the integrated circuit design. At step 760, at least one common clock path for the pair of source and target registers are identified. As shown in FIG. 7, source register 720A and target register 720B both share a common clock path denoted by a dotted-line box. End-of-life or aging pessimism in the timing analysis on segments that diverge from the common clock path is determined at step 770. The end-of-life pessimism determined at step 770 is removed at step 780.

In one embodiment, a timing analysis engine in a CAD tool may identify diverging path segments from an identified common clock path. Accordingly, the end-of-life pessimism on the diverging path segments may be determined by calculating the difference between the maximum and minimum delays on the diverging path segments. The percentage of the difference that is due to end-of-life effects on the diverging path segments may be multiplied with the difference between the maximum and minimum delays to obtain the end-of-life pessimism for the diverging path segments. In one embodiment, the diverging path segments may include a data path and a clock path (e.g., the respective PATHS A and B of FIG. 7A) and the steps depicted in FIG. 7B may be performed during a timing analysis operation. As such, when the end-of-life pessimism is removed from the diverging path segments at step 780, the setup margin of the data path segment and the hold margin of the clock path segment may be increased.

Figure 8:
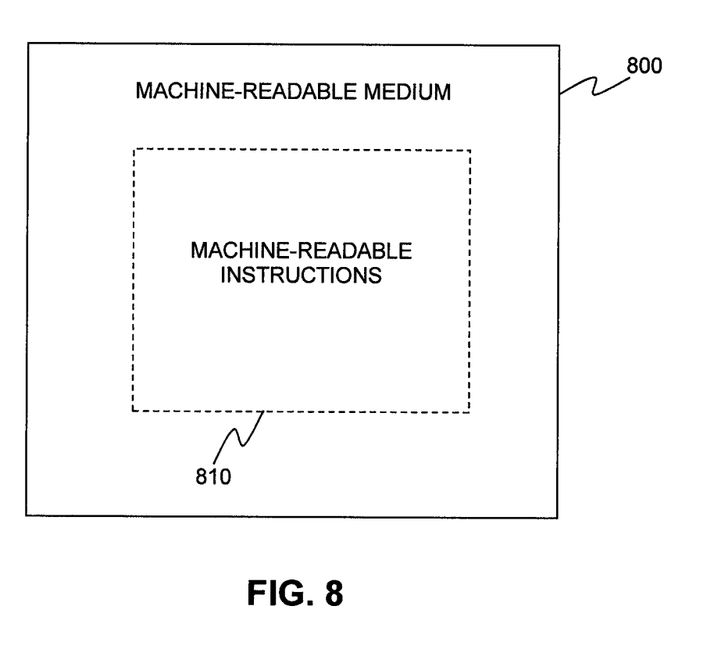
FIG. 8 is an illustrative diagram of a machine-readable medium with machine-readable instructions in accordance with one embodiment of the present invention.

The methods and steps described herein may be embodied as machine-readable instructions 810 on machine-readable storage medium 800 as shown in FIG. 8. Machine-readable storage medium 800 is any data storage device that can store data, which can thereafter be read (e.g., retrieved) by a machine or a computer system. Illustrative examples of machine-readable storage medium 800 include hard drives, network attached storage (NAS), read-only memory, random-access memory, CDs, DVDs, USB drives, volatile and non-volatile memory, and other optical and non-optical data storage devices. Machine-readable storage medium 800 may also be distributed over a network-coupled computer system so that machine-readable instructions 810 are stored and executed in a distributed fashion. Machine-readable instructions 810 may perform any or all of the operations illustrated in FIGS. 4, 5, 6 and 7B.

Figure 9:
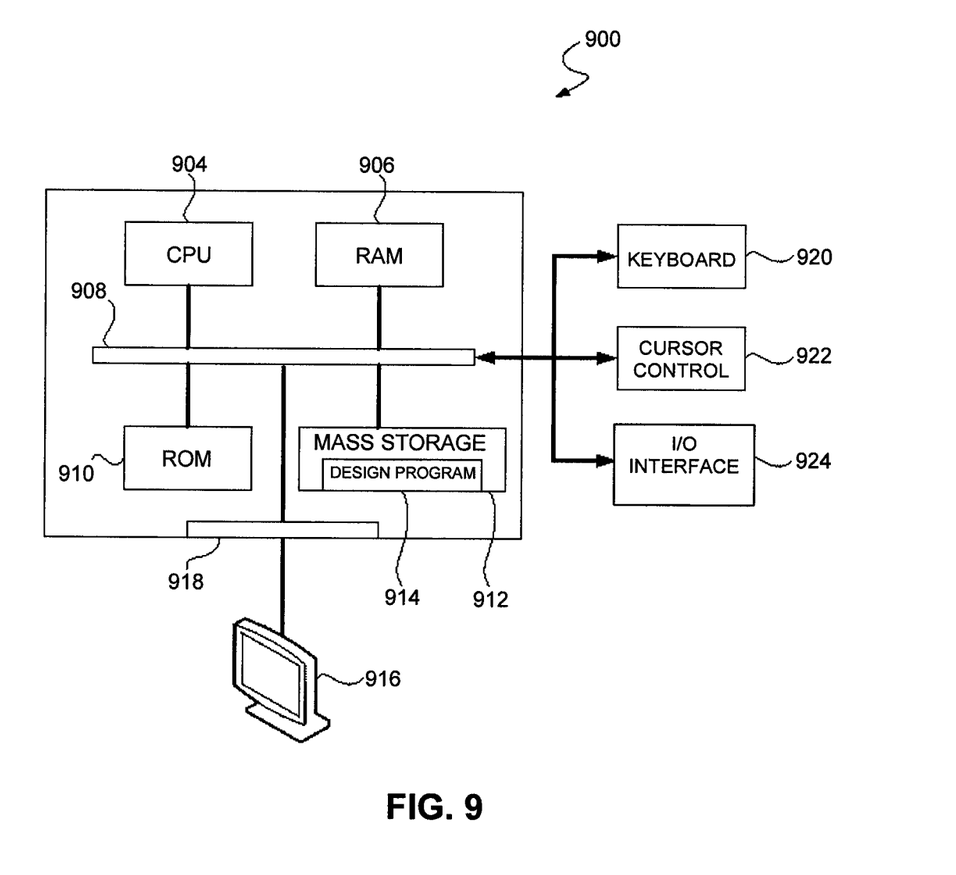
FIG. 9 is a simplified schematic diagram of a computer system for implementing embodiments of the present invention.

FIG. 9 is a simplified schematic diagram of a computer system 900 for implementing embodiments of the present invention. It should be appreciated that the methods described herein may be performed with a digital processing system, such as a conventional, general-purpose computer system. Special-purpose computers, which are designed or programmed to perform one function may be used in the alternative. The computer system of FIG. 9 may be used for the purpose of timing analysis and optimization of a circuit design. The computer system includes a central processing unit (CPU) 904, which is coupled via bus 908 to random access memory (RAM) 906, read-only memory (ROM) 910, and mass storage 912. Mass storage device 912 represents a persistent data storage device such as a floppy disc drive or a fixed disc drive or any other machine-readable storage media such as machine-readable medium 800 of FIG. 8, which may be local or remote. Design program 914, e.g., an electronic design assistant (EDA) or computer-aided design (CAD) tool that can perform any or all of the operations illustrated in FIGS. 2, 4, 5, 6 and 7B resides in mass storage 912, but may also reside in RAM 906 during processing. It should be appreciated that CPU 904 may be embodied in a general-purpose processor, a special-purpose processor, or a specially programmed logic device.

Referring still to FIG. 9, display 916 is in communication with CPU 904, RAM 906, ROM 910, and mass storage device 912, via bus 918. Display 916 may be configured to display the user interface and visual indicators or graphical representations applicable to any or all of the methods described herein. Keyboard 920, cursor control 922, and input-output interface 924 are coupled to bus 908 to communicate information (e.g., user inputs) to CPU 904. It should be appreciated that data to and from external devices may be communicated through input-output interface 924.

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A method for performing timing analysis on an integrated circuit design, the method comprising:
   identifying a timing arc of the integrated circuit design;
   obtaining a probability of the timing arc;
   based on the probability, calculating, with a processor, an aging effect for the timing arc;
   calculating a recovery effect for the timing arc; and
   adjusting, with the processor, maximum and minimum delays for the timing arc based at least partly on the calculated aging effect and the recovery effect of the timing arc.

2. The method defined in claim 1, wherein adjusting the maximum and minimum delays comprises:
   increasing the maximum and minimum delays for the timing arc.

3. The method defined in claim 2 wherein increasing the maximum delay for the timing arc comprises increasing the maximum delay by an amount that is less than a worst case end-of-life amount.

4. The method defined in claim 2, wherein the timing arc comprises a non-gated clock path in the integrated circuit design,
   wherein calculating the recovery effect comprises calculating the recovery effect for the timing arc based at least partly on a frequency of a clock source of the timing arc.

5. The method defined in claim 4, wherein increasing the minimum delay comprises:
   determining a difference between the calculated aging effect and the calculated recovery effect to obtain a net aging effect for the timing arc, wherein the minimum delay is increased by the net aging effect.

6. The method defined in claim 1, wherein the timing arc comprises a data path, wherein obtaining the probability of the timing arc comprises:
   obtaining upper and lower ranges of the probability for the timing arc.

7. The method defined in claim 6, wherein calculating the aging effect on the timing arc based on the probability comprises:
   calculating a minimum aging effect based on the lower range of the probability; and
   calculating a maximum aging effect based on the upper range of the probability, wherein the minimum delay is adjusted based at least on the minimum aging effect and wherein the maximum delay is adjusted based on the maximum aging effect.

8. The method defined in claim 7 further comprising:
   determining a difference between the minimum aging effect and the recovery effect to obtain a net minimum aging effect for the timing arc, wherein the minimum aging effect is adjusted by the net minimum aging effect.

9. Software on a computer-readable storage media to be implemented on a computer-aided design tool to perform timing analysis on an integrated circuit design, comprising:
   code for identifying a timing arc in the integrated circuit design, wherein the timing arc has minimum and maximum delays;
   code for calculating an end-of-life effect for the timing arc; and
   code for adjusting the minimum and maximum delays for the timing arc based at least partly on the calculated end-of-life effect to reduce pessimism in the timing analysis, wherein the minimum delay is adjusted by a first amount, and wherein the maximum delay is adjusted by a second amount that is different than the first amount.

10. The software defined in claim 9 further comprising:
    code for performing a synthesis operation on the integrated circuit design to obtain a synthesized netlist of the integrated circuit design.

11. The software defined in claim 10 further comprising:
    code for performing delay annotation on the synthesized netlist to obtain the minimum and maximum delays.

12. The software defined in claim 9, wherein the timing arc comprises a plurality of timing arcs, and wherein the plurality of timing arcs comprise clock paths and data paths.

13. The software defined in claim 12 further comprising:
    code for, for each clock path of the plurality of timing arcs:
       determining a probability associated with that clock path, wherein the end-of-life effect of that clock path is calculated based on the probability of that clock path; and
    code for, for each data path of the plurality of timing arcs:
       identifying upper and lower probability range values for that data path, wherein the minimum delay for the data path is adjusted based at least partly on the end-of-life effect and the lower range value, and wherein the maximum delay for the data path is adjusted based on the end-of-life effect and the upper range value.

14. The software defined in claim 13, wherein identifying the upper and lower range values comprises:
    code for receiving the upper and lower range values from a user.

15. The software defined in claim 13 further comprising:
    code for performing a synthesis operation on the integrated circuit design to obtain the upper and lower range values.

16. The software defined in claim 9 further comprising:
    code for determining a recovery effect for the timing arc; and
    code for calculating a difference between the recovery effect and the end-of-life effect of the timing arc to obtain a net end-of-life effect for the timing arc, wherein adjusting the minimum delay for the timing arc comprises increasing the minimum delay of the timing arc by the net end-of-life effect of the timing arc.

17. The software defined in claim 9, wherein the code for adjusting the minimum and maximum delays for the timing arc comprises adjust the minimum delay by the first amount that is less than the second amount.

18. A method of performing timing analysis on an integrated circuit design having a plurality of timing arcs using computing equipment, wherein the plurality of timing arcs comprise clock paths and data paths, the method comprising:
    with the computing equipment, identifying a static probability of a timing arc in the integrated circuit design;

with the computing equipment, estimating an aging effect for the timing arc based on the identified static probability;

with the computing equipment, modeling a range of delays for the timing arc based on the estimated aging effect; and with the computing equipment, identifying a clock path of the timing arcs that has 50% static probability.

19. The method defined in claim 18 wherein modeling the range of delays for the timing arc based on the estimated aging effect comprises:

in response to identifying the clock path that has 50% static probability, modeling the range of delays for the identified clock path based on the estimated aging effect.

20. The method defined in claim 19 wherein the range of delays comprises a maximum delay and a minimum delay and wherein modeling the range of delays for the identified clock path based on the estimated aging effect comprises:

adjusting the maximum delay and the minimum delay of the identified clock path based on the estimated aging effect.

21. The method defined in claim 20 further comprising:

with the computing equipment, identifying data paths of the timing arcs;

with the computing equipment, obtaining a range of static probabilities for each of the data paths; and with the computing equipment, modeling a range of delays for each of the data paths based on the obtained range of static probabilities of that data path.

* * * * *